United States Patent [19]
Ferla et al.

[11] Patent Number: 5,631,476
[45] Date of Patent: May 20, 1997

[54] MOS-TECHNOLOGY POWER DEVICE CHIP AND PACKAGE ASSEMBLY

[75] Inventors: Giuseppe Ferla, Catania; Ferruccio Frisina, Sant'Agata Li Battiati, both of Italy

[73] Assignees: SGS-Thomson Microelectronics S.r.l., Agrate Brianza; Consorzio per la Ricerca sulla Microelettronica Nel Mezzogiorno, Catania, both of Italy

[21] Appl. No.: 509,956

[22] Filed: Aug. 1, 1995

[30] Foreign Application Priority Data

Aug. 2, 1994 [EP] European Pat. Off. ............ 94830394

[51] Int. Cl.$^6$ ...................... H01L 23/498; H01L 29/74
[52] U.S. Cl. ...................... 257/177; 257/691; 257/696; 257/724
[58] Field of Search .................... 257/177, 181, 257/584, 587, 666, 675, 691, 693, 696, 724, 728

[56] References Cited

U.S. PATENT DOCUMENTS

| | | | |
|---|---|---|---|
| 3,434,019 | 3/1969 | Carley | 317/235 |
| 3,831,067 | 8/1974 | Wislocky et al. | 317/234 |
| 4,008,486 | 2/1977 | Byczkowski | 357/74 |
| 4,015,278 | 3/1977 | Fukuta | 357/22 |
| 4,055,884 | 11/1977 | Jambotkar | 29/571 |
| 4,070,490 | 1/1978 | Wickstrom | 357/68 |
| 4,145,700 | 3/1979 | Jambotkar | 357/23 |
| 4,236,171 | 11/1980 | Shen | 357/68 |
| 4,305,087 | 12/1981 | Wislocky | 357/79 |
| 4,329,642 | 5/1982 | Luthi et al. | 324/158 |
| 4,376,286 | 3/1983 | Lidow et al. | 357/23 |
| 4,399,449 | 8/1983 | Herman et al. | 357/53 |
| 4,412,242 | 10/1983 | Herman et al. | 357/52 |
| 4,414,560 | 11/1983 | Lidow | 357/39 |
| 4,556,896 | 12/1985 | Meddles | 357/70 |
| 4,593,302 | 6/1986 | Lidow et al. | 357/23.4 |
| 4,641,418 | 2/1987 | Meddles | 29/588 |
| 4,642,419 | 2/1987 | Meddles | 174/52 |
| 4,663,820 | 5/1987 | Ionescu | 29/590 |
| 4,680,853 | 7/1987 | Lidow et al. | 29/571 |
| 4,683,553 | 7/1987 | Nilarp | 29/580 |
| 4,789,882 | 12/1988 | Lidow | 357/23.4 |
| 4,794,431 | 12/1988 | Park | 357/19 |
| 4,845,545 | 7/1989 | Abramowitz et al. | 357/74 |

(List continued on next page.)

FOREIGN PATENT DOCUMENTS

| | | | |
|---|---|---|---|
| 1136291 | 11/1982 | Canada | H01L 29/94 |
| 0237932 | 9/1987 | European Pat. Off. | H01L 29/60 |
| 0323843 | 7/1989 | European Pat. Off. | H01L 27/06 |
| 0526656 | 2/1993 | European Pat. Off. | H01L 23/12 |
| 1224335 | 3/1977 | United Kingdom | H01L 11/14 |
| 2087648 | 5/1982 | United Kingdom | H01L 23/00 |

OTHER PUBLICATIONS

European Search Report from European Patent Application No. 94830394.6, filed Aug. 2, 1994.

*Primary Examiner*—Peter Toby Brown
*Attorney, Agent, or Firm*—Wolf, Greenfield & Sacks, P.C.; James H. Morris

[57] ABSTRACT

In a MOS-technology power device chip and package assembly, the MOS-technology power device chip comprises a semiconductor material layer in which a plurality of elementary functional units is integrated, each elementary functional unit contributing a respective fraction to an overall current and including a first doped region of a first conductivity type formed in the semiconductor layer, and a second doped region of a second conductivity type formed inside the first doped region; the package comprises a plurality of pins for the external electrical and mechanical connection; the plurality of elementary functional units is composed of sub-pluralities of elementary functional units, the second doped regions of all the elementary functional units of each sub-plurality being contacted by a same respective metal plate electrically insulated from the metal plates contacting the second doped regions of all the elementary functional units of the other sub-pluralities; each of the metal plates are connected, through a respective bonding wire, to a respective pin of the package.

11 Claims, 3 Drawing Sheets

U.S. PATENT DOCUMENTS

| | | | |
|---|---|---|---|
| 4,853,762 | 8/1989 | Ewer et al. | 357/79 |
| 4,878,099 | 10/1989 | Nilarp | 357/71 |
| 4,965,173 | 10/1990 | Gould | 430/317 |
| 5,047,833 | 9/1991 | Gould | 357/71 |
| 5,130,767 | 7/1992 | Lidow et al. | 357/23.4 |
| 5,338,974 | 8/1994 | Wisherd et al. | 257/666 |
| 5,356,086 | 10/1994 | Pezzani | 257/157 |
| 5,371,405 | 12/1994 | Kagawa | 257/666 |

MOS-TECHNOLOGY POWER DEVICE CHIP AND PACKAGE ASSEMBLY

BACKGROUND OF THE INVENTION

1. Field of the Invention

The present invention relates to a MOS-technology power device chip and package assembly.

2. Discussion off the Related Art

Conventional MOS-technology power device chips (e.g. power MOSFETs) include a semiconductor layer in which several millions of elementary vertical MOSFET units are integrated; an insulated gate layer having a mesh structure is superimposed over the semiconductor layer to form a common gate electrode for all the elementary MOSFET units, and is connected to a metal pad. The insulated gate layer is covered by an insulating material layer in which contact windows to underlying source regions of all the elementary MOSFET units are opened. The chip surface is almost completely covered by a metal layer which, through the windows in the insulating material layer, contacts the source regions of all the elementary MOSFET units, thus forming a source electrode of the power MOSFET; the bottom surface of the chip is also covered by a metal layer forming a drain electrode of the power MOSFET. After the device chip has been inserted in the desired package, the gate metal pad, the source metal layer and the drain metal layer are bonded to respective wires which are in turn connected to external pins of the package, for Electrical and mechanical connection to traces on a Printed Circuit Board (PCB).

The package must be a power package, and must exhibit high power capability and high power density. The package pins, expecially those forming the external source and drain terminals of the power MOSFET, conduct very high currents.

An important aspect to be considered when choosing a power package is represented by the parasitic electrical components introduced by the package. In fact, the parasitic resistance of the bonding wires and of the package pins causes an increase in the ourput resistance of the power device, which in turn causes an increase in power dissipation, while the parasitic inductance of the bonding wires and of the package pins is responsible for inductive switching problems.

A possible solution calls for bonding to the source metal layer of the device chip more than one wire in this way, due to the parallel connection of the parasitic. resistance and inductance are reduced. The problem is that this solution is not reliable, because there is no way during device testing to ascertain how many wires arc effectively in contact with the source electrode on the chip:

It is also known that even in the power device field there is a trend toward Surface Mount Technology (SMT) packages, since they allow an increase in productivity. They also reduce the PCB area, and they allow production of PCBs with components mounted on both sides. For example, an SMT multipin power package, known under the commercial name "Power SO-10TM", has recently been developed for Power Integrated. Circuits (PICs), which have multiple outputs.

In view of the state ortho art described, it is an object of the present invention to provide a MOS-technology power device chip and package assembly overcoming at least the abovementioned drawbacks.

SUMMARY OF THE INVENTION

According to the present invention, such object and others are attained by means of a MOS-technology power device chip and package assembly, the MOS-technology power device chip comprising a semiconductor material layer in which a plurality of elementary functional units is integrated, each elementary functional unit contributing a respective fraction to an overall current and comprising a first doped region of a first conductivity type formed in said semiconductor layer, and a second doped region of a second conductivity type formed inside said fast doped region, the package comprising a plurality of pins for external electrical and mechanical connection, wherein said plurality of elementary functional units is composed of sub-pluralities of elementary functional units, the second doped regions of all the elementary functional units of each sub-plurality being contacted by a same respective metal plate electrically insulated from the metal plates contacting the second doped regions of all the elementary functional traits of the other sub-pluralities, each of said metal plates being connected, through a respective bonding wire, to a respective pin of the package.

Referring for example to the case of a power MOSFET chip, this means that the source metal layer which conventionally contacts the source regions of all the elementary MOSFET units is split into a plurality of source metal plates electrically isolated from each other, each of said source metal plates contacting the source regions of a respective subset of all the elementary MOSFET units. Each source metal plate is connected, by means of a respective wire bonded thereto, to a respective pin of the package. Said pins (source electrode pins) can be short-circuited at the PCB level, to parallely connect the elementary MOSFET units of all the subsets in parallel: the maximum current capability of the power device is thus re-established. However, it is also possible to leave the source electrode pins electrically separated, or to short circuit just some of them while leaving the others electrically separated, according to the specific application thus improving the design flexibility.

Preferably, the package layout and the choice of the package pins which are to be connected to the source metal plates of the power device chip should be made so that the wires connecting the source metal plates to the package pins have substantially the same length, so that the parasitic resistances and inductances introduced by the wires and the pins are substantially the same for every source metal plate.

As a result of the present invention, the impact of the parasitic resistances and inductances of the wires and of the pins on the device electrical characteristics are reduced, due to the parallel connection of several wires and pins, as in the cited prior-art case wherein several wires are bonded between a package pin and the unique source metal layer. The advantage of the present invention over this prior-art case resides in the full testability of the packaged device from the point of view of the effective electrical connection of all the wires to a respective source metal plate after the device chip has been packaged, by testing the source electrode pins individually.

Furthermore, since the source metal plates are separated from each other, they can be surrounded by a gate metal mesh contacting the insulated gate layer which forms the gates of all the elementary MOSFET units, and which is connected to one or more gate metal pads in this way, the gate resistance of the device is reduced.

According to a preferred embodiment of the present invention, the package is a Surface Mount Technology power package, such as the commercially known PowerSO-10TM.

BRIEF DESCRIPTION OF THE DRAWINGS

The features of the present invention will be made more evident by the following detailed description of a particular embodiment, illustrated as a non-limiting example in the annexed drawing, wherein.

DETAILED DESCRIPTION

Figure 1:
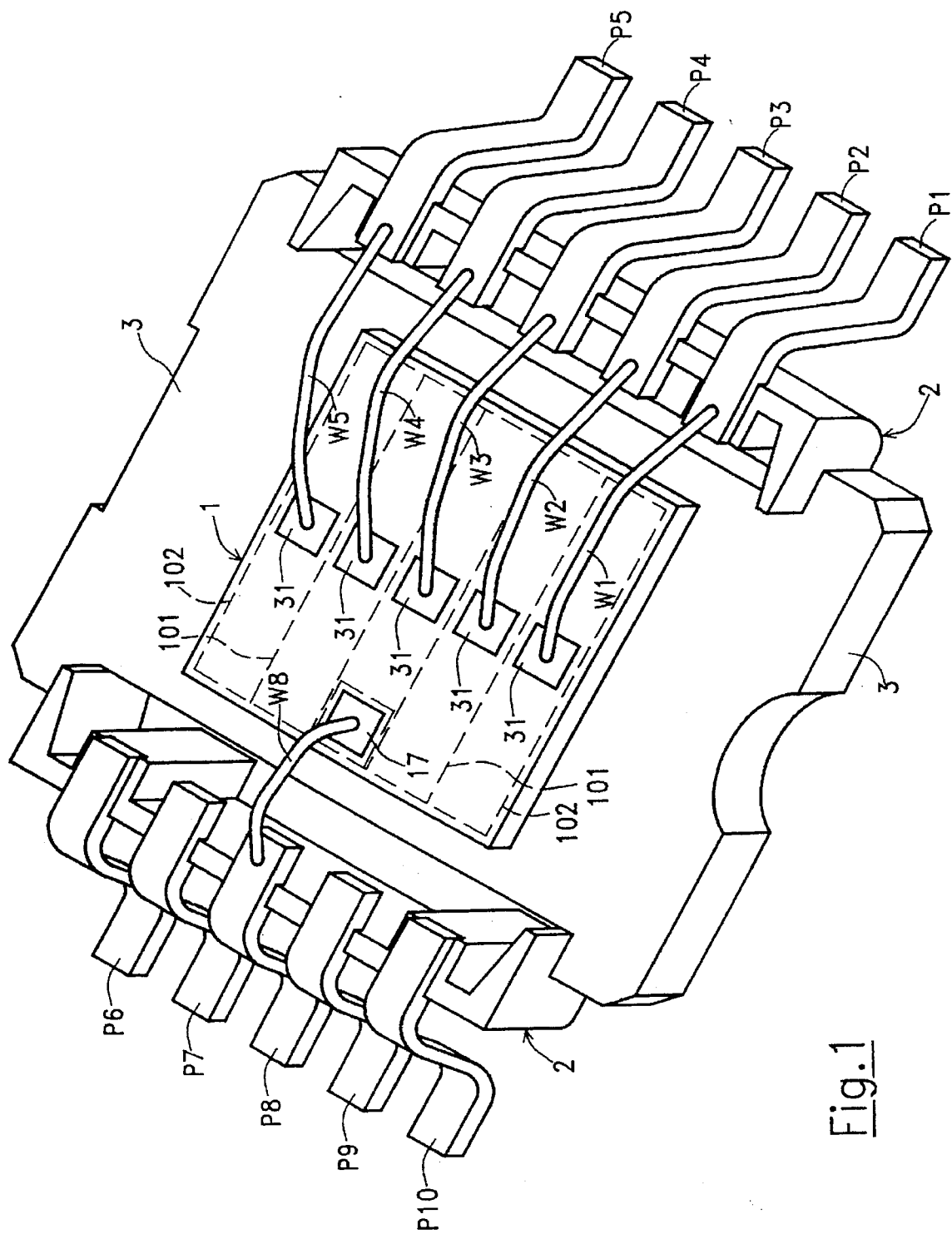
FIG. 1 is a perspective view of a MOS-technology power device chip and package assembly according to the present invention, before the package is closed.

With reference to FIG. 1, there is shown a semiconductor device chip and package assembly comprising a MOS-technology power device chip 1 and a package 2. The package 2 is a Dual-In-line multipin Package (DIP), having for example ten external metal pins PI–P10 for electrical and mechanical connection to signal traces on a Printed Circuit Board (PCB) not shown. The package 2 also comprises a bottom metal plate 3 for electrical and mechanical connection to a metal pad provided on the PCB: the package 2 has therefore eleven external electrical terminals. More particularly, the package shown is designed for Surface Mount Technology (SMT), and is for example the commercially known "PowerSO-10™", which is an SMT package designed for smart power devices or Power Integrated Circuits (PIGs) with a large number of pins.

Figure 4:
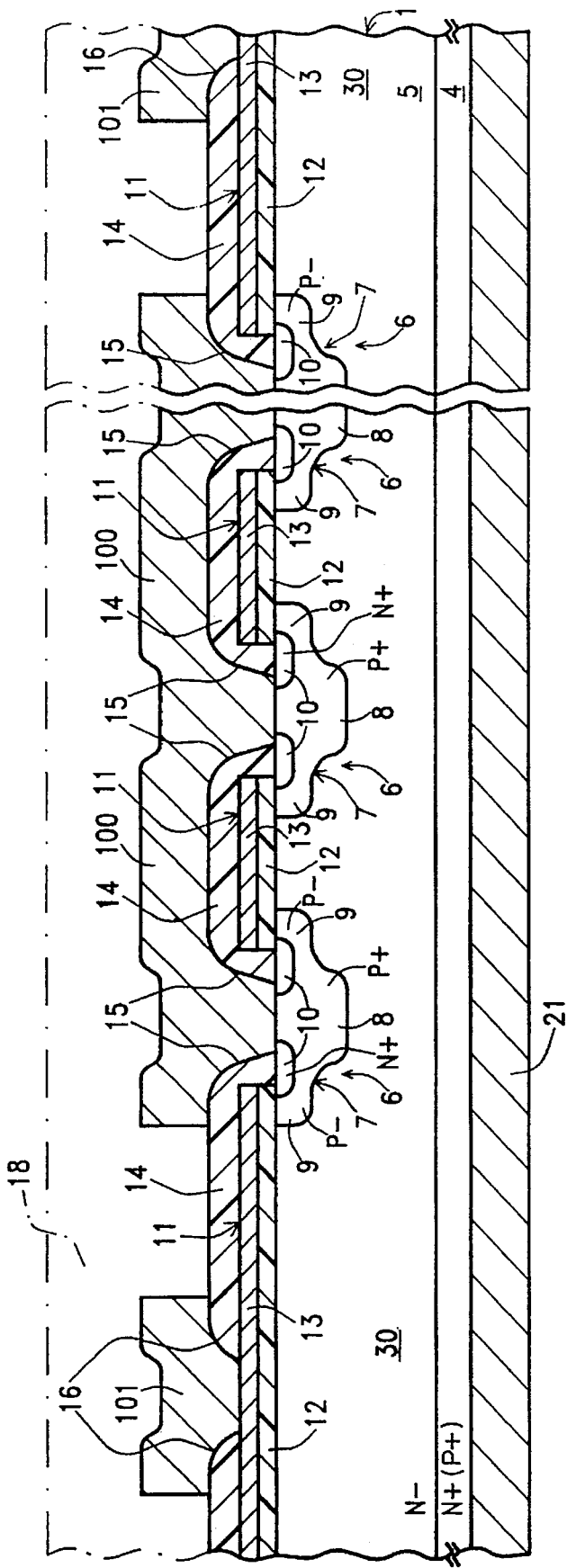
FIG. 4 is an enlarged cross-sectional view of the MOS-technology power device chip taken along the plane IV—IV of FIG. 3.
Figure 2:
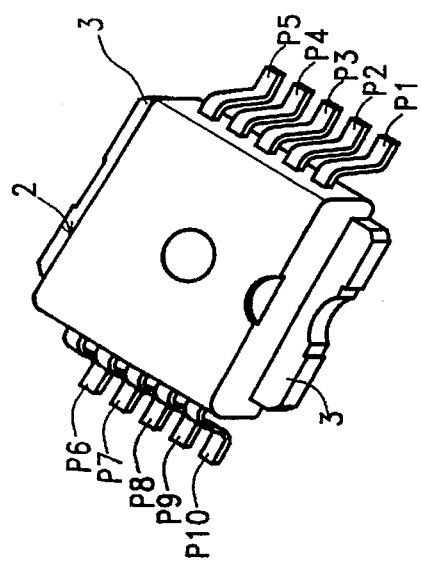
FIG. 2 is a perspective view of the chip and package assembly shown in FIG. 1, after the package has been closed.

The MOS-technology power device chip 1 is for example a power MOSFET chip or an Insulated Gate Bipolar Transistor (IGBT) chip. As known, these are cellular devices and are composed of a plurality of elementary functional cells contributing respective fractions to the overall power device current. As shown in FIG. 4, the power MOSFET chip 1 comprises an N+semiconductor substrate 4 over which an N–semiconductor layer 5 is formed, conventionally by epitaxial growth. A plurality of elementary MOSFET cells 6 is formed in the N–layer 5; each cell 6 comprises a P type body region 7 having a polygonal plan, for example square, made up of a P+deep body region 8 and a lateral P–channel region 9; an annular N+source region 10 is formed in each body region 7. The surface of the N–layer 5 is selectively covered by a conductive insulated gate layer 11 comprising a thin gate oxide layer 12 and a conductive gate layer 13 (generally of polysilicon); the insulated gate layer 11 extends over the channel regions 9 but is absent over the middle portion of each elementary cell 6, thus forming a sort of mesh over the N–layer 5. The insulated gate layer 11 is covered by an insulating material layer 14, in which contact windows 15 are opened over each elementary cell 6.

Figure 3:
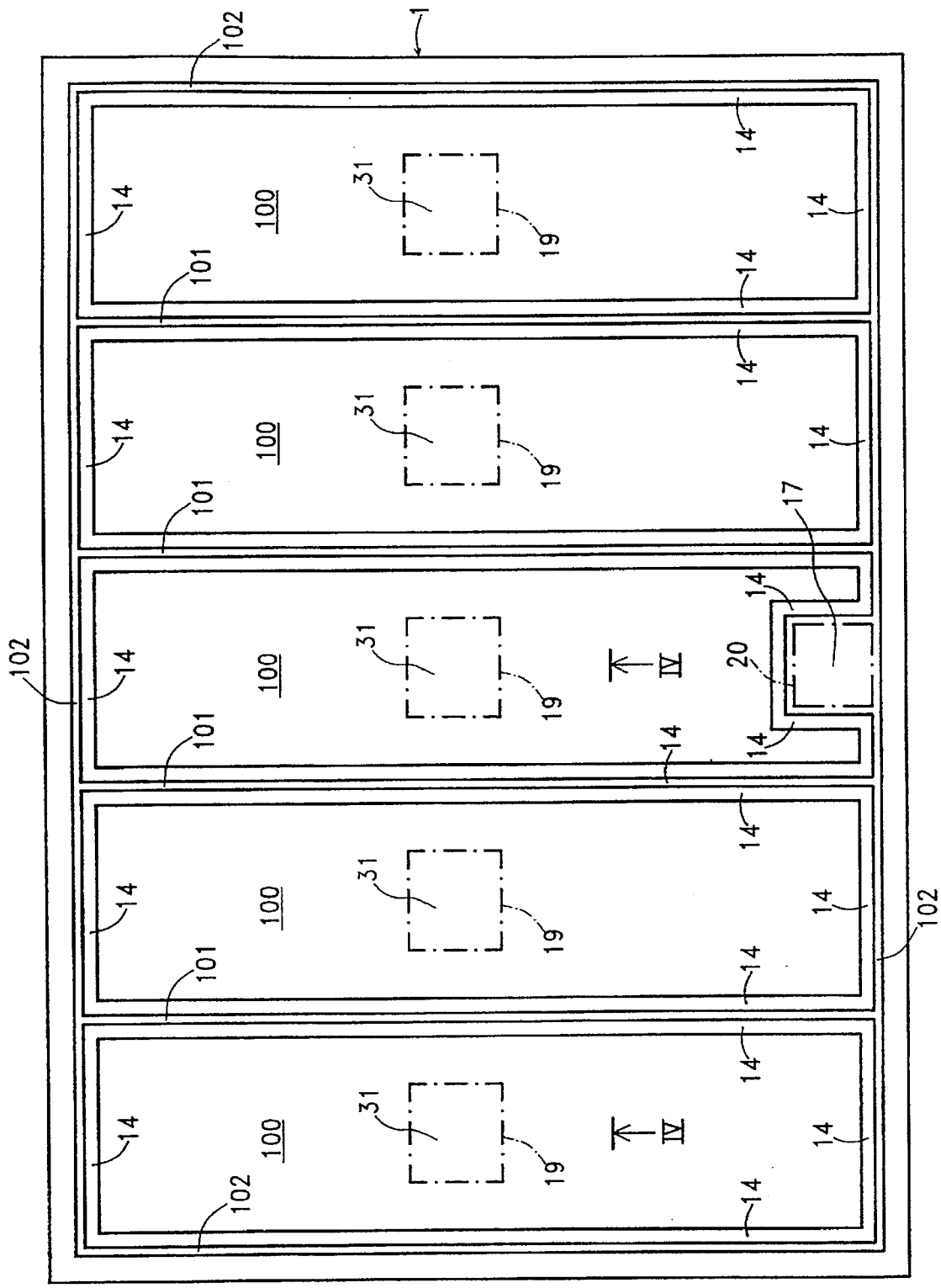
FIG. 3 is an enlarged top plan view of the MOS-technology power device chip of FIG. 1.

Conventionally, a unique source metal layer contacts all the elementary MOSFET cells 6 integrated in the N–layer 5. By contrast, in the present invention, as shown in FIG. 3, a plurality of source metal plates 100 is provided, for example five, each source metal plate 100 contacting through the contact windows 15 the source regions 10 and the deep body regions 8 of a respective sub-plurality of the plurality of elementary MOSFET cells 6. Said sub-pluralities of elementary MOSFET cells 6 are substantially rectangular arrays of cells 6 which are separated by elongated regions 30 of the N–layer 5 which are covered by the insulated gate layer 11 and the insulating material layer 14, but wherein no elementary cells 6 are integrated. Elongated contact windows 16 are opened in the insulating material layer 14 over the elongated regions 30 of the N–layer 5, to allow narrow gate metal fingers 101 to contact the conductive gate layer 13. The gate metal fingers 101 are thus intercalated with the source metal plates 100 and connected to a gate metal pad 17. The conductive gate layer 13 is also contacted by a gate metal lane 102 surrounding the source metal plates 100.

The surface of the chip is covered by a passivating material layer 18 (shown in dash-and-dot line in FIG. 4) in which windows 19 are opened over the source metal plates 100 to form source pads 31, and a contact window 20 is also opened over the gate metal pad 17. The bottom surface of the N+substrate 4 is also covered by a drain metal layer 21.

Coming back to FIG. 1, the above-mentioned five source metal plates 100 are respectively connected to the first five pins P1–P5 of the package 2, by means of respective wires W1–W5 bonded to the source metal plates, at the pads 31, and to the pins P1–P5. Preferably, all the source metal plates are connected to pins situated along a same side of the package 2, so that the bonding wires W1–W5 have the same length. The gate metal pad is also connected to a package pin P8 by means of a wire Wd. The bottom surface of the chip 1 is soldered on the metal plate 3 so that the drain metal layer 21 is in electrical and mechanical contact with said plate 3.

According to the embodiment shown in FIG. 1, there is thus obtained a chip and package assembly in which five distinct source pins P1–P5 are present. Depending on the particular application, the pins P1–P5 can be short-circuited at the PCB level, or they can be left separated.

It would also be possible to provide more than one gate metal pad, to be connected by respective wires to separate package pins.

Even if the previous description is referred to a power MOSFET chip, the present invention applies as well to IGBT chips.

Having thus described at least one illustrative embodiment of the invention, various alterations, modifications, and improvements will readily occur to those skilled in the arc. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. MOS-technology power device chip and package assembly, MOS-technology power device chip comprising a semiconductor material layer in which a plurality of elementary functional units is integrated, each elementary functional unit contributing a respective fraction to an overall current and comprising a first doped region of a first conductivity type formed in said semiconductor layer, and a second doped region of a second conductivity type formed inside said first doped region, the package comprising a plurality of pins for the external electrical and mechanical connection, wherein said plurality of elementary functional units is composed of sub-pluralities of elementary functional units, the second doped regions of all the elementary functional units of each sub-plurality being contacted by a same respective metal plate electrically insulated from the metal plates contacting the second doped regions of all the elementary functional units of the other sub-pluralities, each of said metal plates being connected, through a respective bonding wire, to a respective pin of the package.

2. MOS-technology power device chip and package assembly according to claim 1, wherein said sub-pluralities of elementary functional units are separated by regions of said semiconductor layer in which no elementary functional units are integrated.

3. MOS-technology power device chip and package assembly according to claim 2, wherein said semiconductor material layer is selectively covered by a conductive insulated gate layer partially extending over said first doped regions, said insulated gate layer being contacted by gate metal mesh surrounding said source metal plates and connected to at least one gate metal pad which is in tarn connected, by means of a respective bonding wire, to a respective pin of the package.

4. MOS-technology power device chip and package assembly according to claim 3, wherein said gate metal mesh comprises gate metal fingers intercalated to said metal plates, and a gate metal lane surrounding the periphery of the power device chip.

5. MOS-technology power device chip and package assembly according to claim 1, wherein said semiconductor material layer comprises a lightl of the second conductivity type superimposed over a heavily doped semiconductor substrate.

6. MOS-technology power device chip and package assembly according to claim 5, wherein said semiconductor substrate is of the second conductivity type, to form a power MOSFET.

7. MOS-technology power device chip and package assembly according to claim 5, wherein said semiconductor substrate is of the first conductivity type, to form an 1GBT.

8. MOS-technology power device chip and package assembly according to claim 1, wherein said first conductivity type is P type, and said second conductivity type is N type.

9. MOS-technology power device chip and package assembly according to claim 1, wherein said first conductivity type is N type, and said second conductivity type is P type.

10. MOS-technology power device chip and package assembly according to claim 1, wherein said package is a multipin Dual-In-Line Surface Mount Technology (SMT) power package.

11. MOS-technology power device chip and package assembly according to claim 1, wherein said bonding wires have a same length.

* * * * *